(12) United States Patent
Bilger et al.

(10) Patent No.: US 7,920,433 B2
(45) Date of Patent: Apr. 5, 2011

(54) METHOD AND APPARATUS FOR STORAGE DEVICE WITH A LOGIC UNIT AND METHOD FOR MANUFACTURING SAME

(75) Inventors: Christoph Bilger, Munich (DE); Peter Gregorius, Munich (DE); Michael Bruennert, Munich (DE); Maurizio Skerlj, Munich (DE); Wolfgang Walthes, Munich (DE); Johannes Stecker, Munich (DE); Hermann Ruckerbauer, Moos (DE); Dirk Scheideler, Munich (DE); Roland Barth, Ottobrunn (DE)

(73) Assignee: Qimonda AG, Munich (DE)

( * ) Notice: Subject to any disclaimer, the term of this patent is extended or adjusted under 35 U.S.C. 154(b) by 572 days.

(21) Appl. No.: 11/971,819

(22) Filed: Jan. 9, 2008

(65) Prior Publication Data

US 2009/0175100 A1    Jul. 9, 2009

(51) Int. Cl.
*G11C 7/06* (2006.01)

(52) U.S. Cl. ......... 365/189.17; 365/189.02; 365/189.05; 365/230.08

(58) Field of Classification Search ............. 365/189.17, 365/189.02, 189.05, 230.08
See application file for complete search history.

(56) References Cited

U.S. PATENT DOCUMENTS

| | | | |
|---|---|---|---|
| 6,145,016 A * | 11/2000 | Lai et al. | 710/4 |
| 2002/0176308 A1 * | 11/2002 | Nakayama et al. | 365/230.03 |
| 2006/0282754 A1 * | 12/2006 | Kobayashi | 714/800 |
| 2008/0062743 A1 * | 3/2008 | Mayer et al. | 365/149 |

* cited by examiner

*Primary Examiner* — Tuan T Nguyen
*Assistant Examiner* — Toan Le
(74) *Attorney, Agent, or Firm* — Patterson & Sheridan, LLP

(57) ABSTRACT

Method and apparatus that relate to a storage device comprising a plurality of memory cells, an interface device configured to connect the storage device to a host system and configured to transmit signals to read and write data from the host system to the memory cells via a first and second data path, and a logic unit. The logic unit is configured to read and write data from the plurality of memory cells via the second data path, and configured to perform logic operations on data stored in the plurality of memory cells. When performing read and write operations, the first data path excludes the logic unit, and the second data path includes the logic unit. Furthermore, the logic unit is communicatively coupled between the interface device and the plurality of memory cells. Additionally, a method for manufacturing the memory device is provided.

25 Claims, 4 Drawing Sheets

METHOD AND APPARATUS FOR STORAGE DEVICE WITH A LOGIC UNIT AND METHOD FOR MANUFACTURING SAME

BACKGROUND OF THE INVENTION

The invention relates to the field of memory devices, for example semi-conductor memory devices such as DRAM, SRAM or Flash-EEPROM. The invention relates to a memory device and an interface to a host system for optimized data transfer between the memory device and the host system comprising said memory device.

A known memory device comprises a plurality of memory cells and may comprise some integrated circuits to perform some basic functions of the memory device such as mapping addresses to memory cells, hiding defective memory cells from further use or the like. The memory device may be integrated on a single semi-conductor die or a plurality of semi-conductor dies assembled in a single package. Some or more of these packages or dies may be assembled on a printed circuit board.

Memory devices are commonly used in electronic systems incorporating digital electronics, such as personal computers, music players, digital cameras, networking servers, routers or the like. An electronic system comprising said memory device is hereinafter referred to as host system. A memory device may be inserted into the host system as a separate module or may be integrated on the same printed circuit board. Usually, the host system comprises a microprocessor to perform its basic tasks. Furthermore, the host system comprises a memory control unit, either integrated into the microprocessor, integrated into the memory device or as a stand-online device. The memory control unit is configured to establish and control an interface between at least one memory device and the host system.

Physically, the interface may comprise a plurality of transmission lines. A subset of these transmission lines may be combined to form a data bus, another subset of transmission lines may form an address bus and a further subset of transmission lines may constitute a command bus.

The host system and the memory device are synchronized by a common clock signal. To perform read- or write-operations on the memory device, the memory control unit specifies the address of at least one memory cell and transmits this address and the respective command and the data if needed to the memory device where the command is executed by writing the data to the specified address or reading data from the specified address and delivering it to the host system.

To perform any operation on data stored in the memory device, the memory control unit has to perform a read-operation to make said data available to the micro processor of the host system. In the next step, the micro processor may perform an operation on said data. The result of said operation is transferred by a write command performed by said memory control unit to the memory device. This procedure leads to a high load on the interface between the host system and the memory device.

Therefore, there is a need to optimize the data transfer between the memory device and the host system.

BRIEF DESCRIPTION OF THE DRAWINGS

For a more complete understanding of the present invention and the advantages thereof, reference is made to the description taken in conjunction with the accompanying drawings in which.

DETAILED DESCRIPTION OF THE PREFERRED EMBODIMENT

Figure 1:
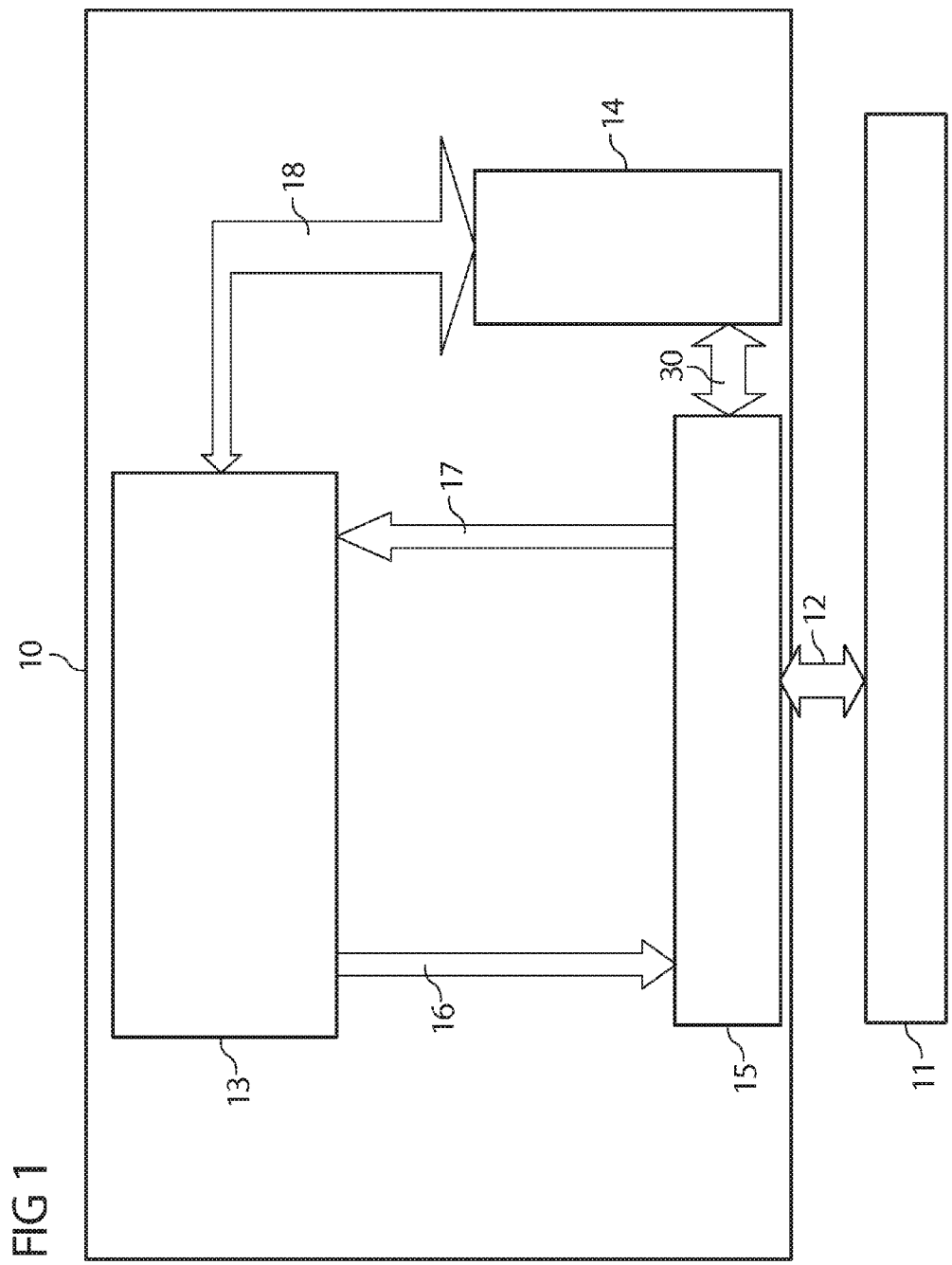
FIG. 1 shows a schematic diagram of a memory device according to one embodiment of the present invention.

One embodiment relates to a storage device. The storage device generally comprises a plurality of memory cells and an interface device. The interface device is configured to connect the storage device to a host system and configured to transmit signals to read and write data from the host system to the plurality of memory cells via at least one of a first data path and a second data path. The storage device also comprises at least one logic unit. The logic unit is configured to read and write data from the plurality of memory cells via the second data path, and configured to perform logic operations on data stored in the plurality of memory cells. The first data path excludes the at least one logic unit, and the second data path includes the at least one logic unit. Additionally, the at least one logic unit is communicatively coupled between the interface device and the plurality of memory cells.

Another embodiment relates to a storage device. The storage device generally comprises a plurality of memory cells and an interface device. The interface device is configured to connect the storage device to a host system and configured to read and write data from the host system to the plurality of memory cells via at least one of a first data path and a second data path. The storage device also comprises at least one logic unit. The at least one logic unit is configured to read and write data from the plurality of memory cells via the second data path, and configured to perform logic operations on data stored in the plurality of memory cells. The storage device also comprises a write buffer and a read buffer. The write buffer is connected to the plurality of memory cells, to the interface device and to the at least one logic unit, and is configured to store data received by any of the interface device, the host system, and the at least one logic unit. The read buffer is connected to the plurality of memory cells, the interface device, and the at least one logic unit, and is configured to store data transmitted to any of the host system and the at least one logic unit. The first data path excludes the at least one logic unit, and the second data path includes the at least one logic unit. Additionally, the at least one logic unit is communicatively coupled between the interface device and the plurality of memory cells.

Another embodiment relates to a method for operating a storage device comprising a plurality of memory cells. The method generally comprises writing data from a host system to the plurality of memory cells by use of an interface device via at least one of a first data path and a second data path, reading at least a subset of the data from the plurality of memory cells and delivering the data to a logic unit integrated into the storage device via the second data path, performing at least one logic operation on the subset of data by use of the logic unit, and writing the output of the logic unit to any of the host system, by use of the interface device, and the plurality memory cells. The first data path excludes the logic unit, and the second data path includes the logic unit. Additionally, the logic unit is communicatively coupled between the interface device and the plurality of memory cells.

Another embodiment relates to a method for manufacturing a storage device. The method generally comprises providing a plurality of memory cells on a semiconductor die, providing an interface device configured to connect the storage device to a host system and configured to read and write data from the host system to plurality of memory cells via at least one of a first data path and a second data path, and providing at least one logic unit, wherein the at least one logic unit is configured to read and write data to the plurality of memory cells via a second data path and configured to perform logic operations on data stored in the plurality of memory cells. The first data path excludes the at least one logic unit, and the second data path includes the at least one logic unit. Additionally, the logic unit is communicatively coupled between the interface device and the plurality of memory cells.

Reference is made to FIG. 1 which shows a schematic diagram of a memory device according to one embodiment of the invention. A memory device 10 is connected by use of an interface device 12 to host system 11.

The host system 11 comprises at least a microprocessor to perform the basic functions of the host system. The type of these basic functions depends on the type of said host system 11 which may comprise e.g. a personal computer, a digital camera, a music player, a networking server, a router or a network switching device.

Data, addresses and commands are sent and received by the sending and receiving unit 15 on the memory device 10. The sending and receiving unit 15 is intended to distribute received data to their respective addresses according to the received command. As an example, the sending and receiving unit 15 may receive a write command specifying some data and their respective addresses. In this case, the sending and receiving unit 15 will transmit the data by use of the data transmission path 17 to the memory cells 13 indicated by the respective addresses. After the write command has been executed, the data will be left in storage cells 13 until they are overwritten by different data or read by a corresponding read signal. To perform its tasks, the sending and receiving unit 15 may comprise some memory cells to store and decode data, commands and addresses received by the host system 11.

If the sending and receiving unit 15 receives a read signal and a respective address, the specified memory cells are activated and the data are transmitted by use of data transmission path 16 to the sending and receiving unit 15. The sending and receiving unit 15 will transmit the data by use of the interface 12 to the host system 11. In one embodiment, the data transmission path 16 and the transmission path 17 may collectively be called a first data path, where the first data path may transfer data between the plurality of memory cells 10 and the sending and receiving unit 15.

The memory device 10 comprises further at least one logic unit 14. Said logic unit 14 is able to read and write data from said memory cells 13 by use of the bidirectional data path 18. In another embodiment not detailed in FIG. 1, the bidirectional data path 18 may be substituted by two separate unidirectional data paths intended to read and write data from memory cells 13 to the logic unit 14.

The logic unit 14 may be configured to perform basic logic operations such as AND, NAND, OR, XOR, NOR, or XNOR. Additionally, the logic unit 14 may perform more complex logic operations such as sorting, searching or compressing of data. To perform these operations, said logic unit may comprise a micro processor. If a respective command is send from host system 11 and received by the sending and receiving unit 15, it is handed over from the sending and receiving unit 15 to the logic unit 14 for execution. The result of such an operation is either written to the memory cells 13 or handed back to the host system 11 by use of the interface 12 and the sending and receiving unit 15.

As an example, the host 11 may request all data stored in memory cells 13 comprising a certain bit pattern. The request and the bit pattern is transferred by use of the interface 12 to unit 15. The sending and receiving unit 15 transfers the request and the bit pattern to the logic unit 14. The logic unit 14 reads all data stored in memory cells 13 by use of the data path 18 and performs the comparison with said bit pattern. If some data correspond to this bit pattern, these data are transferred by use of the data path 30 to unit 15 and from the sending and receiving unit 15 by use of the interface 12 to the host system 11. By this measure, the interface 12 has to transfer only the result of the logic operation instead of transferring all data stored in the storage cells 13 in order to be searched by the microprocessor in the host system 11. In one embodiment, the bidirectional data path 18 and data path 30 may collectively be called a second data path, where the second data path may transfer data between the plurality of memory cells 13, the logic unit 14, and the sending and receiving unit 15.

In another example, the host system 11 may request the memory device to perform a logic XOR-operation on two bits stored in the memory cells 13. The request is handed over to unit 15. The sending and receiving unit 15 sends the request by use of data path 30 to the logic unit 14. The logic unit 14 retrieves the respective bits from the memory cells 13 by use of the data path 18. In the next step, the logic unit 14 will perform the XOR operation. The result of the XOR operation is written back by use of the data path 18 to the memory cells 13. The target address may be specified by the host system 11 or by the logic unit 14. In this case, the logic unit 14 will communicate the chosen address by use of data path 30 to unit 15 which may communicate this address by use of interface 12 to host system 11.

The two examples above have been used to explain the cooperation of the parts of the invention. It has to be noted that the invention is not limited to these examples. There exists many different applications of the logic unit 14 to perform different logic operations on data received by unit 15 from host system 11 or stored in the storage cells 13.

Figure 2:
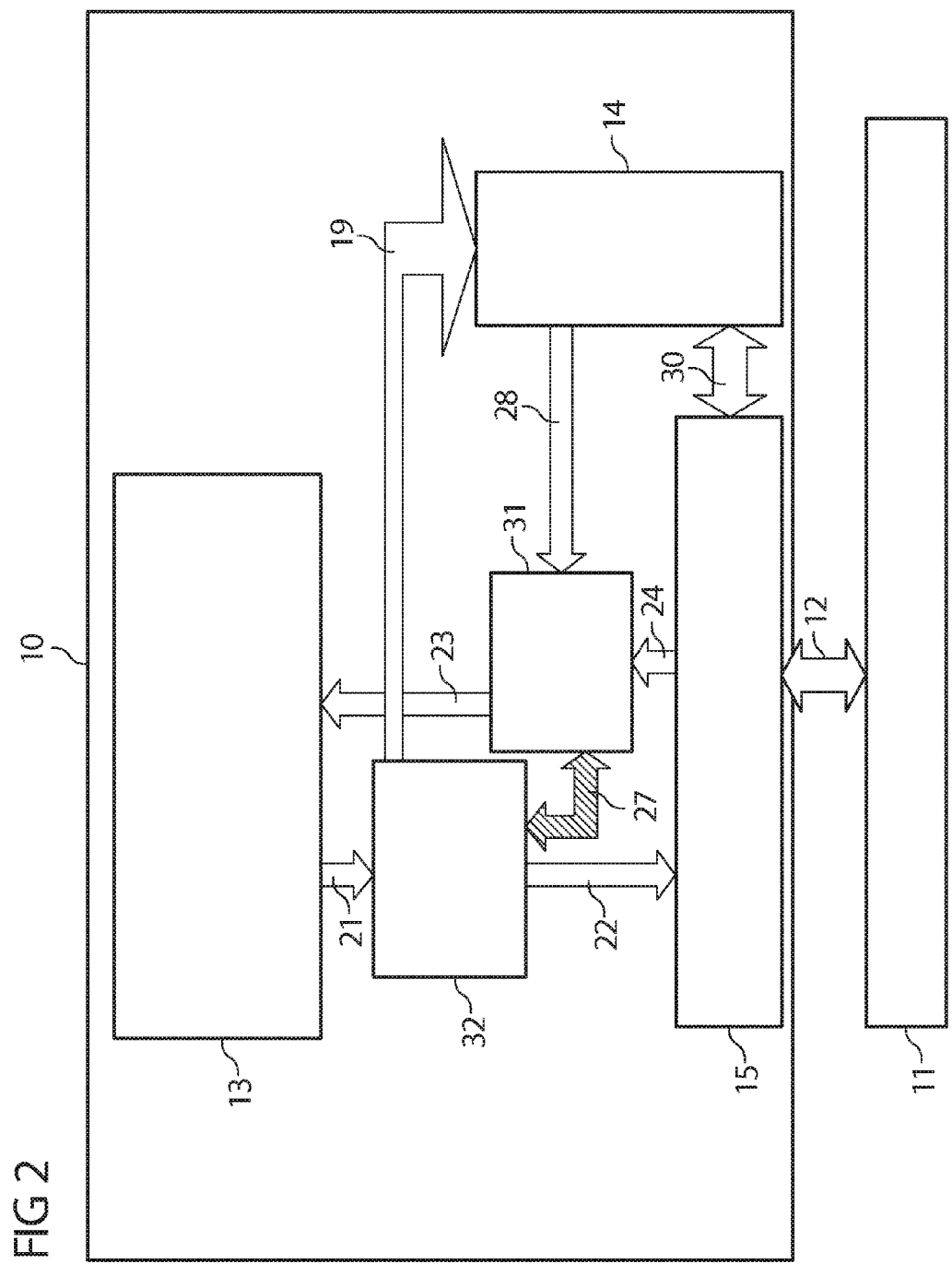
FIG. 2 shows a schematic diagram of a further embodiment of a memory device according to the present invention including read- and write-buffers.

FIG. 2 shows another embodiment of the invention. FIG. 2 shows a memory device 10 which is connected by use of the data path 12 to a host system 11. Data received from the host system 11 or sent to the host system 11 are processed by a sending and receiving unit 15. The sending and receiving unit 15 cooperates with logic unit 14 by use of the data path 30.

The data path 17 detailed in FIG. 1 is split in two parts 23 and 24. The sending and receiving unit 15 cooperates by use of data path 24 with a write buffer 31. The write buffer 31 cooperates with the memory cells 31 by use of the data path 23. The data received from the host system 11 to be stored in the memory cells 13 are received by the sending and receiving unit 15 by use of the interface 12. The sending and receiving unit 15 transfers the data by use of the data path 24 to the write buffer 31. From the write buffer 31 the data are transferred by use of the data path 23 to the memory cells 13. The write buffer 31 may comprise memory cells with a shorter access time compared to the access time of the memory cells 13. In one embodiment, the above-mentioned data paths (data path 23, data path 24) may be considered part of a first data path.

To perform a read request initiated by the host system 11, the data to be read are transferred from the memory cells 13 by use of the data path 21 to the read buffer 32. From the read buffer 32 data are transferred by use of the data path 22 to the sending and receiving unit 15. From the sending and receiving unit 15, the data are transferred by use of the interface 12 to the host system 11. The read buffer 32 may comprise memory cells with a shorter access time compared to the access time of the memory cells 13.

The read buffer 32 as well as the write buffer 31 may be organized as a FIFO-storage means, a LIFO-storage means or a random access storage. In one embodiment, the above-mentioned data paths (data path 21, data path 22) may also be considered part of the first data path.

In case the host system 11 requests a logic operation to be performed by logic unit 14, the respective command is received by the sending and receiving unit 15. The sending and receiving unit 15 transfers the command via the data path 30 to the logic unit 14. As an example, the logic operation may comprise a logic AND-operation between two data bits. The respective data bits are read from the memory cells 13 by use of the data path 21 and moved or copied to the read buffer 32. From the read buffer 32, the data are transferred by use of the data path 19 to the logic unit 14. The result of the logic operation, e.g. one bit representing the result "bit 1" AND "bit 2", is transferred by use of the data path 28 to the write buffer 31. The "AND"-operation detailed above is only an example. Different, more complex operations may be executed by use of the logic unit 14 on the data stored in the same manner.

From the write buffer 31 the result may be transferred by use of the data path 23 to the memory cells 13. It may be stored there for further usage.

In case the result of the logic operation should be transferred to the host system 11, the data is transferred by use of the bidirectional data path 27 to the read buffer 32. From the read buffer 32, the data is transferred by use of the data path 22 to the sending and receiving unit 15 and then by use of the interface 12 to the host system 11.

In one embodiment, requests for a logic operation utilize a second data path. Any data path connected to the logic unit 14 may be considered part of the second data path. Accordingly, the second data path may comprise any of data path 30, data path 19 and data path 28.

It has to be noted that various modifications to the basic concept detailed in FIG. 2 may be added without leaving the scope of the present invention. As an example, the data paths 19 and 28 may be implemented as bidirectional data paths. In this case, the bidirectional data path 27 may be omitted. As an example, a result delivered by the logic unit 14 intended to be sent to the host system 11 may be transferred by data path 19 directly to the read buffer 32. In case a result delivered to the write buffer 31 is needed by logic unit 14 as an input value for a further logic operation, this data may be read by use of the bidirectional data path 28 directly from the write buffer 31 without prior transfer to the read buffer 32.

Figure 3:
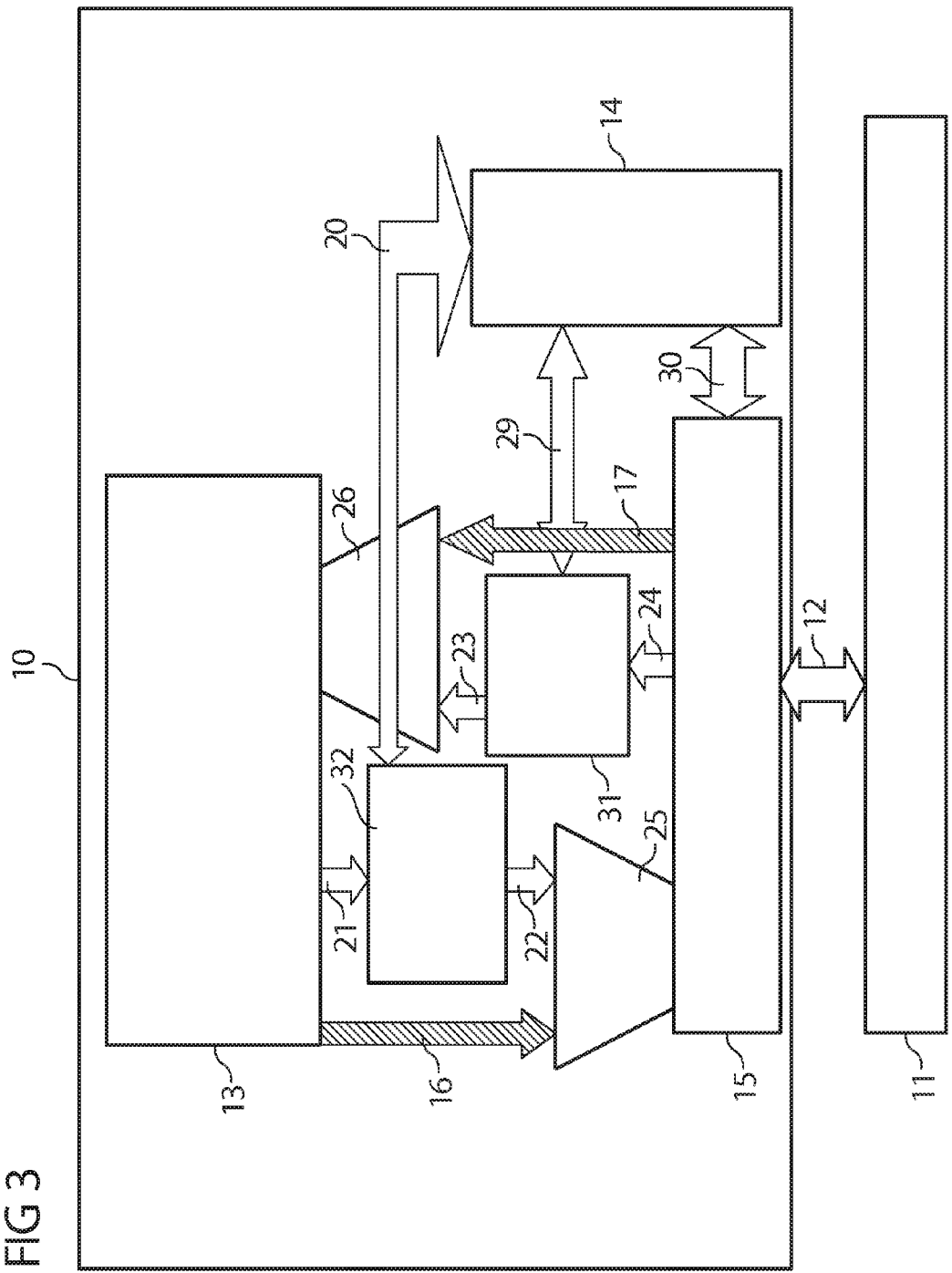
FIG. 3 shows a schematic diagram of a memory device according to still another embodiment of the present invention comprising a read- and write-buffer and multiplexing units connected to said buffers.

FIG. 3 shows another embodiment of the invention. FIG. 3 shows a memory device 10 which is connected by use of the interface 12 to a host system 11. Data received from the host system 11 or sent to the host system 11 are processed by a sending and receiving unit 15. The sending and receiving unit 15 cooperates with logic unit 14 by use of the data path 30.

Data received by unit 15 and intended to be sent to memory cells 13 may be transmitted either by use of the data path 17 or by use of the data path 24, the write buffer 31 and the data path 23. In order to enable one data path or the other, the data paths 17 and 23 are connected to the memory cells 13 by use of a multiplexing device 26.

Data received from the host system 11 to be stored in the memory cells 13 are received by the sending and receiving unit 15 by use of the interface 12. The sending and receiving unit 15 transfers the data by use of the data path 24 to the write buffer 31. From the write buffer 31 the data are transferred by use of the data path 23 to the memory cells 13. The multiplexing device 26 is in a first state connecting the data path 23 with the storage cells 13. The write buffer 31 may comprise memory cells with a shorter access time compared to the access time of the memory cells 13.

As an alternative, data received from the host system 11 to be stored in the memory cells 13 are received by the sending and receiving unit 15 by use of the interface 12 and subsequently sent by use of data path 17 to the storage cells 13. The multiplexing device 26 is in a second state connecting the data path 17 with the storage cells 13. Bypassing the write buffer 31 allows for lower latency of the write operation. In one embodiment, the above-mentioned data paths (data path 17, data path 23, data path 24) may be considered part of a first data path.

Data stored in memory cells 13 and intended to be sent to the host system 11 may be transmitted either by use of the data path 16 or by use of the data path 21, the read buffer 32 and the data path 22. In order to enable one data path or the other, the data paths 16 and 22 are connected to the sending and receiving unit 15 by use of a multiplexing device 25.

To perform a read request initiated by the host system 11, the data to be read are transferred from the memory cells 13 by use of the data path 21 to the read buffer 32. From the read buffer 32 data are transferred by use of the data path 22 to the sending and receiving unit 15. From the sending and receiving unit 15, the data are transferred by use of the interface 12 to the host system 11. During this mode of operation, the multiplexing device 25 is in a first state connecting the data path 22 with the sending and receiving unit 15. The read buffer 32 may comprise memory cells with a shorter access time compared to the access time of the memory cells 13.

As an alternative, data to be sent to the host system 11 are received from the memory cells 13 by the sending and receiving unit 15 by use of the data path 16. The multiplexing device 25 is in a second state connecting the data path 16 with the sending and receiving unit 15. Bypassing the read buffer 32 allows for lower latency of the read operation. In one embodiment, the above-mentioned data paths (data path 16, data path 21, data path 22) may be considered part of a first data path.

In case the host system 11 requests a logic operation to be performed by logic unit 14, the respective command is received by the sending and receiving unit 15. The sending and receiving unit 15 transfers the command via the data path 30 to the logic unit 14. As an example, the logic operation may comprise a logic NOR-operation involving two data bits. The respective data bits are read from the memory cells 13 by use of the data path 21 and moved or copied to the read buffer 32. From the read buffer 32, the data are transferred by use of the data path 20 to the logic unit 14. The result of the logic operation, e.g. one bit representing the result "bit 1" NOR "bit 2", is transferred by use of the bidirectional data path 29 to the write buffer 31. The "NOR"-operation detailed above is only an example. Different, more complex operations may be executed by use of the logic unit 14 on the data stored in the same manner.

From the write buffer 31 the result may be transferred by use of the data path 23 to the memory cells 13. It may be stored there for further usage.

In case the result of the logic operation should be transferred to the host system 11, the data is not transferred to the write buffer 31 but to the read buffer 32 by use of the bidirectional data path 20. From the read buffer 32, the data is transferred by use of the data path 22 to the sending and receiving unit 15 and then by use of the interface 12 to the host system 11. During this operation, the multiplexing device 25 is in a first state connecting the data path 22 with the sending and receiving unit 15.

In case the result of the first logic operation is needed as an input value for a second subsequent logic operation, the respective data can be read by the logic unit 14 by use of the bidirectional data path 29 directly from the write buffer 31.

In one embodiment, requests for a logic operation utilize a second data path. Any data path connected to the logic unit 14 may be considered part of the second data path. Accordingly, the second data path may comprise any of data path 30, data path 20 and data path 29.

Figure 4:
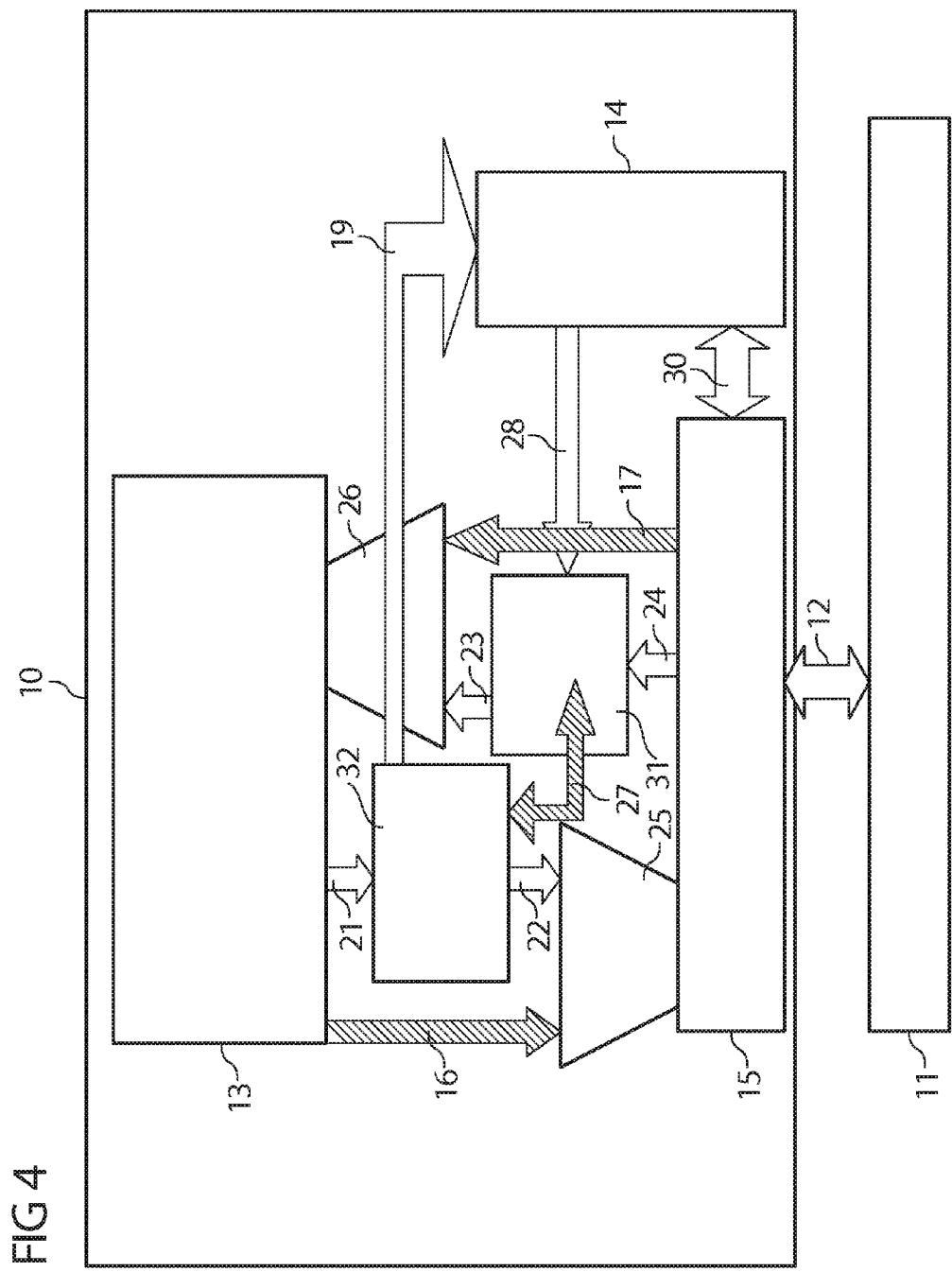
FIG. 4 shows a diagram of a further embodiment of the present invention wherein the read- and the write-buffer are configured to exchange data to each other.

FIG. 4 shows another embodiment of the invention. FIG. 4 shows a memory device 10 which is connected by use of the interface 12 to a host system 11. Data received from the host system 11 or sent to the host system 11 are processed by a sending and receiving unit 15. The sending and receiving unit 15 cooperates with logic unit 14 by use of the data path 30.

Data received by unit 15 and intended to be sent to memory cells 13 may be transmitted either by use of the data path 17 or by use of the data path 24, the write buffer 31 and the data path 23. In order to enable one data path or the other, the data paths 17 and 23 are connected to the memory cells 13 by use of a multiplexing device 26.

Data received from the host system 11 to be stored in the memory cells 13 are received by the sending and receiving unit 15 by use of the interface 12. The sending and receiving unit 15 transfers the data by use of the data path 24 to the write buffer 31. From the write buffer 31 the data are transferred by use of the data path 23 to the memory cells 13. The multiplexing device 26 is in a first state connecting the data path 23 with the storage cells 13. The write buffer 31 may comprise memory cells with a shorter access time compared to the access time of the memory cells 13.

As an alternative, data received from the host system 11 to be stored in the memory cells 13 are received by the sending and receiving unit 15 by use of the interface 12 and subsequently sent by use of data path 17 to the storage cells 13. The multiplexing device 26 is in a second state connecting the data path 17 with the storage cells 13. Bypassing the write buffer 31 allows for lower latency of the write operation. In one embodiment, the above-mentioned data paths (data path 17, data path 23, data path 24) may be considered part of a first data path.

Data stored in memory cells 13 and intended to be sent to the host system 11 may be transmitted either by use of the data path 16 or by use of the data path 21, the write buffer 32 and the data path 22. In order to enable one data path or the other, the data paths 16 and 22 are connected to the sending and receiving unit 15 by use of a multiplexing device 25.

To perform a read request initiated by the host system 11, the data to be read are transferred from the memory cells 13 by use of the data path 21 to the read buffer 32. From the read buffer 32 data are transferred by use of the data path 22 to the sending and receiving unit 15. From the sending and receiving unit 15, the data are transferred by use of the interface 12 to the host system 11. During this mode of operation, the multiplexing device 25 is in a first state connecting the data path 22 with the sending and receiving unit 15. The read buffer 32 may comprise memory cells with a shorter access time compared to the access time of the memory cells 13.

As an alternative, data to be sent to the host system 11 are received from the memory cells 13 by the sending and receiving unit 15 by use of the data path 16. The multiplexing device 25 is in a second state connecting the data path 16 with the sending and receiving unit 15. Bypassing the read buffer 32 allows for lower latency of the read operation. In one embodiment, the above-mentioned data paths (data path 16, data path 21, data path 22) may be considered part of a first data path.

In case the host system 11 requests a logic operation to be performed by logic unit 14, the respective command as well as the respective data and addresses if needed is received by the sending and receiving unit 15. The sending and receiving unit 15 transfers the command via the data path 30 to the logic unit 14. As an example, the logic operation may comprise a logic XNOR-operation involving two data bits. The respective data bits are read from the memory cells 13 by use of the data path 21 and moved or copied to the read buffer 32. From the read buffer 32, the data are transferred by use of the data path 19 to the logic unit 14. The result of the logic operation, e.g. one bit representing the result "bit 1" XNOR "bit 2", is transferred by use of the data path 28 to the write buffer 31. The "XNOR"-operation detailed above is only an example. Different, more complex operations may be executed by use of the logic unit 14 on the data stored in the same manner.

As another example, the logic operation may comprise a logic NAND-operation involving two data bits received from the host system 11. The respective data bits are moved to the logic unit 14 from unit 15 by use of the data path 30. The result of the logic operation, e.g. one bit representing the result "bit 1" NAND "bit 2", is transferred by use of the data path 28 to the write buffer 31.

In any case, the result may be transferred from the write buffer 31 by use of the data path 23 to the memory cells 13. It may be stored there for further usage.

In case the result of the logic operation should be transferred to the host system 11, the data is transferred by use of the bidirectional data path 27 to the read buffer 32. From the read buffer 32, the data is transferred by use of the data path 22 to the sending and receiving unit 15 and then by use of the interface 12 to the host system 11. During this operation, the multiplexing device 25 is in a first state connecting the data path 22 with the sending and receiving unit 15.

In case the result of the first logic operation is needed as an input value for a second subsequent logic operation, the respective data can be moved by use of data path 27 from the write buffer 31 to the read buffer 32 and then to the logic unit 14 by use of data path 19.

In one embodiment, requests for a logic operation utilize a second data path. Any data path connected to the logic unit 14 may be considered part of the second data path. Accordingly, the second data path may comprise any of data path 30, data path 19 and data path 28.

The logic unit 14 may be integrated monolithically on the semiconductor die which accommodates the memory cells. In another embodiment, the logic unit may be built on its own semiconductor die which is integrated in the same casing than the memory cells. In still another embodiment, the logic unit may be built on its own semiconductor die which is packed in a separate casing and integrated with the memory cells on a single printed circuit board.

The interface 12 between the host system and the memory device may consist in a plurality of transmission lines. Some of these transmission lines may be dedicated to specific functions. As an example, a first subset of transmission lines may be configured as an address bus for sending address data relating to memory cells 13 from the host system 11 to the memory device 10. A second subset of transmission lines may be configured as a data bus to transmit data from and to the memory cells 13 and to and from the host system 11. A third subset of transmission lines may be configured to act as a command bus to transmit a command from the host system 11 to the memory device 10 for execution.

In another embodiment of the invention, interface 12 may be configured to be a packed based interface comprising at least one transmission line. The packed based interface is configured to transmit a plurality of bits sequentially on the same transmission line. The packed based interface may or may not comprise separated transmission lines for data, addresses and commands. In case that no separate transmission lines are provided, the controller may add some header data to identify the bits transferred to comprise data, addresses or commands. The header included to each package comprising either data, addresses or commands may also include data to mark the beginning and the end of the respective package. Additional transmission lines may be provided to transfer the header simultaneously with data, addresses or commands. A handshake may be implemented to insure that all packets sent have been received. All received data are decoded by use of unit 15.

If the memory device 10 comprises a package based interface 12, unit 15 may operate at a higher clock cycle then subsequent parts of the memory device. In order to maintain synchronization between unit 15, logic unit 14, buffers 31, 32, memory cells 13 and multiplexing devices 25, 26, the clock signal of any part of the memory device 10 has a fixed rate to the clock cycle of the interface 12, e.g. 2, 4, 8 or 16.

To perform a fast read operation, a number of n bits may be transferred from the memory cells 13 by use of data path 16 to unit 15 and sent as a single package to the host system 11. The number n corresponds to the ratio of the clock cycles of the interface 12 and the memory cells 13 respectively. If the memory cells 13 are adapted to read a plurality of bits at one single clock cycle, n times this plurality may be transmitted in a single package.

In either embodiment, the transmission lines forming the interface 12 may be implemented as conductors or as an optical transmission path. An optical transmission path may comprise at least one optical fiber and/or an optical free-space transmission.

Although several embodiments of the invention have been illustrated in accompanying drawings and described in the foregoing detailed description, it will be understood that the invention is not limited to the embodiments disclosed, but is capable of numerous rearrangements, modifications and substitutions without departing from the scope of the invention. The invention has been described in the form of functional elements such as a logic unit 14, a plurality of memory cells 13, a read buffer 32 or a write buffer 31. Those elements are known to those skilled in the art and may be realized in different embodiments. The invention does not rely on the strict realization of a certain embodiment. The interconnects between the functional elements may be realized as optical or wireless connections or based on wires made of a conductive material. The interconnects may connect two functional elements described herein directly or may comprise further functional elements.

What is claimed is:

1. A storage device, comprising:
   a plurality of memory cells;
   an interface device configured to connect the storage device to a host system and configured to transmit signals to read and write data from the host system to the plurality of memory cells via both a first data path and a second data path; and
   at least one logic unit, wherein the logic unit is configured to read and write data from the plurality of memory cells via the second data path and configured to perform logic operations on data stored in the plurality of memory cells, wherein the first data path excludes the at least one logic unit, and the second data path includes the at least one logic unit, and wherein the at least one logic unit is communicatively coupled between the interface device and the plurality of memory cells.

2. The storage device according to claim 1, wherein the interface device is configured to transmit a plurality of correlated data bits sequentially on the same line between the storage device and the host system.

3. The storage device according to claim 1, wherein the interface device is configured to transmit data, addresses and commands between the storage device and the host system sequentially on the same lines.

4. The storage device according to claim 1, wherein the interface device is configured to operate on a higher clock frequency than the plurality of memory cells.

5. The storage device according to claim 1, further comprising a read buffer connected to the plurality of storage cells, the interface device, and to the at least one logic unit, wherein the read buffer is configured to store data to be transmitted to any of the at least one logic unit and the host system.

6. The storage device according to claim 1, further comprising a write buffer connected to the plurality of memory cells, to the interface device and to the at least one logic unit, wherein the write buffer is configured to store data received by any of the host system and the at least one logic unit.

7. The storage device according to claim 5, further comprising a first multiplexer, wherein the first multiplexer comprises:
   a first input;
   a second input; and
   one output, wherein an output of the read buffer is connected to the first input of the multiplexer, the output of the multiplexer is connected to an input of the interface device and the second input of the multiplexer is connected to the plurality of memory cells, and wherein the first multiplexer is configured to bypass the read buffer.

8. The storage device according to claim 6, further comprising a second multiplexer, where in the second multiplexer comprises:
   a first input;
   a second input; and
   one output, wherein an output of the write buffer is connected to the first input of the multiplexer, the output of the multiplexer is connected to the plurality of memory cells and the second input of the multiplexer is connected to an output of the interface device, wherein the second multiplexer is configured to bypass the write buffer.

9. The storage device according to claim 1, wherein the at least one logic unit comprises a micro processor.

10. The storage device according to claim 1, wherein at least the plurality of memory cells and the logic unit are integrated on the same silicon die.

11. A storage device, comprising:
    a plurality of memory cells;
    an interface device configured to connect the storage device to a host system and configured to read and write data from the host system to the plurality of memory cells via both a first data path and a second data path;
    at least one logic unit, wherein the at least one logic unit is configured to read and write data from the plurality of memory cells via the second data path, and configured to perform logic operations on data stored in the plurality of memory cells;
    a write buffer connected to the plurality of memory cells, to the interface device and to the at least one logic unit, wherein the write buffer is configured to store data received by any of the interface device, the host system, and the at least one logic unit; and a read buffer connected to the plurality of memory cells, the interface device, and the at least one logic unit, wherein the read buffer is configured to store data transmitted to any of the host system and the at least one logic unit, wherein the first data path excludes the at least one logic unit, and the second data path includes the at least one logic unit, and wherein the at least one logic unit is communicatively coupled between the interface device and the plurality of memory cells.

12. The storage device according to claim 11, further comprising a first multiplexer, wherein the first multiplexer comprises:

a first input;

a second input; and one output, wherein an output of the read buffer is connected to the first input of the multiplexer, the output of the multiplexer is connected to an input of the interface device, and the second input of the multiplexer is connected to the plurality of memory cells, wherein the first multiplexer is configured to bypass the read buffer.

13. The storage device according to claim 11, further comprising a second multiplexer, wherein the second multiplexer comprises:

a first input;

a second input; and one output, wherein an output of the write buffer is connected to the first input of the multiplexer, the output of the multiplexer is connected to the plurality of memory cells, and the second input of the multiplexer is connected to an output of the interface device, wherein the second multiplexer is configured to bypass the write buffer.

14. The storage device according to claim 11, wherein the interface device is configured to operate on a higher clock frequency than the plurality of memory cells.

15. The storage device according to claim 11, wherein the interface device is configured to transmit data, addresses and commands between the storage device and the host system sequentially on the same lines.

16. The storage device according to claim 11, wherein the at least one logic unit comprises a micro processor.

17. The storage device according to claim 11, wherein at least the plurality of memory cells, the read buffer, the write buffer, and the at least one logic unit are integrated on the same semiconductor die.

18. A method for operating a storage device comprising a plurality of memory cells, the method comprising:

writing data from a host system to the plurality of memory cells by use of an interface device via both a first data path and a second data path;

reading at least a subset of the data from the plurality of memory cells and delivering the data to a logic unit integrated into the storage device via the second data path;

performing at least one logic operation on the subset of data by use of the logic unit; and writing the output of the logic unit to any of the host system, by use of the interface device, and the plurality memory cells, wherein the first data path excludes the logic unit, and the second data path includes the logic unit, and wherein the logic unit is communicatively coupled between the interface device and the plurality of memory cells.

19. The method according to claim 18, wherein the at least one logic operation is selected from at least one of a search operation, a sort operation, a logic AND operation, a logic OR operation, a logic XOR operation, a logic XNOR operation, a logic NOR operation and a logic NAND operation.

20. The method according to claim 18, wherein the step of reading at least a subset of the data from the plurality of memory cells and delivering the data to a logic unit integrated into the storage device via the second data path comprises the step of:

transferring the data into a read buffer and delivering the data from the read buffer to any of the logic unit and the host system.

21. The method according to claim 18, wherein the step of writing the output of the logic unit to any of the host system, by use of the interface device, and the plurality of memory cells comprises the step:

transferring the data into a write buffer and delivering the data from the write buffer to any of the host system, by use of the interface device, and the plurality of memory cells.

22. The method according to claim 18, wherein transferring data to the host system by use of the interface device is performed at a higher clock cycle than reading at least a subset of the data from the plurality of memory cells and delivering the data to the logic unit, wherein the logic unit is integrated into the storage device.

23. A method for manufacturing a storage device, comprising:

providing a plurality of memory cells on a semiconductor die;

providing an interface device configured to connect the storage device to a host system and configured to read and write data from the host system to plurality of memory cells via both a first data path and a second data path; and providing at least one logic unit, wherein the at least one logic unit is configured to read and write data to the plurality of memory cells via a second data path and configured to perform logic operations on data stored in the plurality of memory cells, and wherein the first data path excludes the at least one logic unit, and the second data path includes the at least one logic unit, and wherein the logic unit is communicatively coupled between the interface device and the plurality of memory cells.

24. The method according to claim 23, further comprising the steps of:

providing a write buffer connected to the plurality of memory cells, the interface device and the at least one logic unit, wherein the write buffer is configured to store data received by any of the interface device, the host system, and the at least one logic unit; and providing a read buffer connected to the plurality of memory cells, the interface device and the at least one logic unit, wherein the read buffer is configured to store data to be transmitted to any of the host system and the at least one logic unit.

25. The method according to claim 23, wherein the at least one logic unit and the plurality of memory cells are manufactured on a single semiconductor die.

* * * * *